United States Patent [19]

Yamaguchi et al.

[11] Patent Number: 4,954,993
[45] Date of Patent: Sep. 4, 1990

[54] SEMICONDUCTOR INTEGRATED CIRCUIT HAVING A PLURALITY OF CIRCUIT BLOCKS RESPECTIVELY SUPPLIED WITH POWER FROM DIFFERENT POWER SOURCES

[75] Inventors: Masaya Yamaguchi; Takamasa Suzuki, both of Tokyo, Japan

[73] Assignee: NEC Corporation, Japan

[21] Appl. No.: 214,189

[22] Filed: Jul. 1, 1988

[30] Foreign Application Priority Data

Jul. 2, 1987 [JP] Japan .................................. 62-166320

[51] Int. Cl.⁵ .............................................. G11C 7/00
[52] U.S. Cl. ...................... 365/226; 365/229; 365/227; 365/230.03; 307/64
[58] Field of Search ............... 365/229, 226, 241, 227, 365/230.03; 307/64, 66

[56] References Cited

U.S. PATENT DOCUMENTS

| | | | |
|---|---|---|---|
| 3,859,638 | 1/1975 | Hume, Jr. ........................... | 365/229 |
| 4,288,865 | 9/1981 | Graham .............................. | 365/229 |
| 4,457,021 | 6/1984 | Belisomi ............................. | 365/229 |
| 4,617,473 | 10/1986 | Bingham ............................. | 365/229 |
| 4,669,066 | 5/1987 | Kagawa et al. ..................... | 365/226 |
| 4,710,905 | 12/1987 | Uchida ................................ | 365/229 |
| 4,754,160 | 6/1988 | Ely ...................................... | 365/229 |
| 4,788,450 | 11/1988 | Wagner ............................... | 365/229 |
| 4,823,323 | 4/1989 | Higuchi .............................. | 365/229 |

*Primary Examiner*—Glenn Gossage
*Assistant Examiner*—Alfonso Garcia
*Attorney, Agent, or Firm*—Laff, Whitesel, Conte & Saret

[57] ABSTRACT

A semiconductor integrated circuit has a logic circuit block, a RAM memory block having an input stage of logical gates and energized independently from the logic circuit block, and a detection circuit for detecting a deenergization of the logic circuit block. The logical gates in the input stage are controlled to produce fixed output signals having a logical high or low level.

6 Claims, 3 Drawing Sheets

SEMICONDUCTOR INTEGRATED CIRCUIT HAVING A PLURALITY OF CIRCUIT BLOCKS RESPECTIVELY SUPPLIED WITH POWER FROM DIFFERENT POWER SOURCES

BACKGROUND OF THE INVENTION

1. Field of the Invention

This invention relates to a semiconductor integrated circuit having a plurality of blocks of logic circuits which are differently energized, and more specifically, to an improvement for preventing energized block or blocks from both malfunctions and excessive power consumption when the other block or blocks are deenergized.

2. Description of the Related Art

A large-scale integrated circuit has many circuit blocks in a single semiconductor chip. Some of the circuit blocks have to be powered at all times in order to maintain their operating conditions, even if the other blocks are deenergized. An example of the circuit blocks which are always powered is a random access memory (RAM) block. The semiconductor chip has different power supply terminals. One of the power supply terminals is used for the RAM block, the other being used for other logic circuit blocks. Only the power supply through the other power terminals is disconnected with the energized RAM block.

In the conventional large-scale integrated circuits, the RAM block and other logic circuit block or blocks are directly connected by wirings. Therefore, if the logic circuit blocks are deenergized, their output lines become electrically floating. Accordingly, the RAM block receives the unfixed outputs from the deenergized logic circuit blocks as input signals.

Input gates are provided in the RAM block to receive address and/or data input signals. Therefore, if the potentials at the wirings through which the input signals are supplied to the input gates of the RAM block should be in an electrically floating condition, the outputs of the input gates also float electrically in order to make a current flow through the input gates. This current flow continues until the logic circuit blocks are powered, which results in a considerable power consumption. If the large-scale integrated circuit is equipped in a battery-powered equipment, the battery for the RAM block is quickly consumed.

The potential in the electrically floating condition has an uncontrolled value and easily changes its value in accordance with external noise. Therefore, the inputs for the RAM block become arbitrary values which cause the RAM block to loose the memorized contents.

SUMMARY OF THE INVENTION

It is a primary object of the present invention to provide a semiconductor integrated circuit having differently powered circuit blocks, in which an input signal is not applied to the powered circuit block or blocks when selected circuit block or blocks are deenergized.

It is another object of the present invention to provide a semiconductor integrated circuit, having differently powered circuit blocks, which does not consume excessive power in a condition wherein selected circuit block or blocks are powered off while unselected circuit block or blocks are energized.

According to the present invention, there is provided a semiconductor integrated circuit including a first circuit block having input gates, a second circuit block producing output signals to be supplied to the input gates of the first circuit block, a first power terminal for supplying a first power to the first circuit block, a second power terminal for supplying a second power to the second circuit block, a detection circuit for detecting a deenergization of the second power to generate a detection signal, and a means for controlling the input gates of the first circuit block so as to produce a predetermined fixed voltages as outputs from the input gates in accordance with the detection signal. The present invention is effectively applied to a semiconductor integrated circuit in which first and second blocks of logic circuits are formed and the predetermined fixed voltages are designed to have logical "H" or "L" level.

In accordance with the present invention, since the outputs from the input gates are fixed by the detection signal, the electrical condition in the first block is automatically fixed and is not affected by outputs from the second block which are in an electrically floating condition at a time when the second power is switched off. The electrical condition in the first block is not disturbed and is maintained during the period when the second power is switched off. That is, if the first block includes RAM memories, the memorized contents are not lost during the period when the second power is switched off.

Furthermore, since the outputs from the input gates in the first block are fixed to logical "H" or "L" levels, little current flows through the input gates to consume very little power. Thus, when the semiconductor integrated circuit is powered from batteries, a long-term operation is made possible.

BRIEF DESCRIPTION OF DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
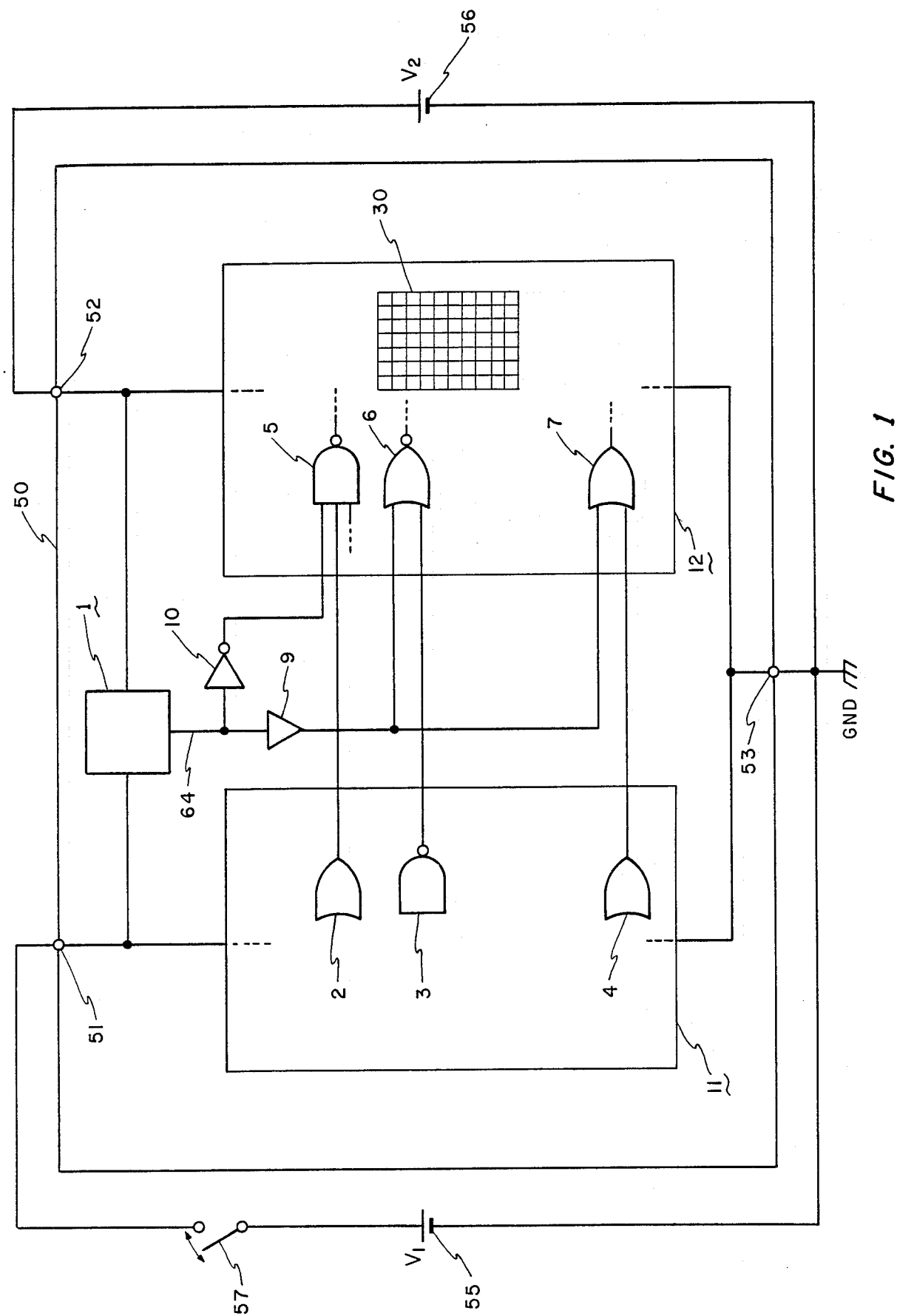
FIG. 1 is a brief circuit block diagram showing a first preferred embodiment of the present invention.
Figure 2:
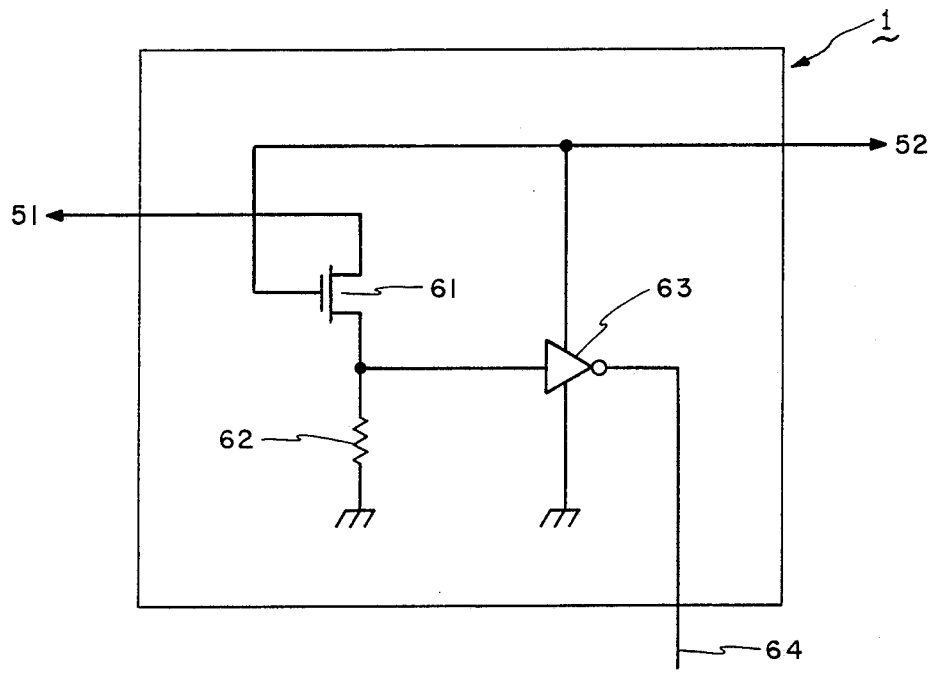
FIG. 2 is a circuit diagram showing a detection circuit used in the first preferred embodiment of FIG. 1.

The first preferred embodiment shown in FIGS. 1 and 2 includes a logic circuit block 11 as a preceding stage, a RAM block 12 as a succeeding stage, and a power detector 1 on a semiconductor chip 50 as principal components. The logic circuit block 11 processes input signals and is energized through a power switch 57 and a power terminal 51 from a power source 55 which is 5 volts, for example. The logic circuit block 11 has an output stage including an OR gate 2, a NAND gate 3 and another OR gate 4 to produce output signals after the input signals are processed.

The output signals are supplied to an input stage of the RAM block 12 to access a RAM section 30. The input stage includes a NAND gate 5, a NOR gate 6 and an OR gate 7. The input stage also receives a detection signal of the power detector through a non-inverting buffer 9 and an inverter 10. The RAM block 12 is constantly energized to keep the memorized contents in the RAM section 30. A different power source 56 operates as a back-up battery of 5 volts, for example. The logic circuit block 11 and the RAM block 12 are grounded through a grounding terminal 53. The kinds of gates in the input stage of the RAM block 12 is arbitrary selected in accordance with required processing of signals applied from the logic circuit block 11. The polarity of the detection signal supplied to the gates in the output stage is selected so as to fix the output level of the gates in the output stage at either a high or a low level.

One example of the power detector 1 is shown in FIG. 2. The power voltage supplied at the power terminal 51 is supplied to a resistor 62 having a resistance of about 100 kilo-ohms, through a source-drain path of a P-channel MOS field effect transistor 61. A gate electrode of the field effect transistor 61 receives a power voltage which is supplied at the power terminal 52 which energizes an inverter 63. An input node of the inverter 63 is connected to a connection point between the field effect transistor 61 and the resistor 62. The output node of the inverter 63 is connected to the non-inverting buffer 9 and the inverter 10 through a wiring 64.

At a time when the power switch 57 turns on to supply a power voltage of the power source 55 to the power terminal 51, the potential at the connection point between the field effect transistor 61 and the resistor 62 is held at almost the same voltage as the power terminal 51. The inverter 63 produces an output having a low level or a grounding level, at the wiring 64. The NOR gate 6 (FIG. 1) and the OR gate 7 receive the low level detection signal through the non-inverting buffer stage 9 to enable a response to the signals from the NAND gate 3 and the OR gate 4 of the output stage in the logic circuit block 11. Similarly, since a high level detection signal is supplied to the NAND gate 5 through the inverter 10, the NAND gate 5 responds to the signal from the OR gate 2 in the logic circuit block 11.

On the contrary, if the power switch 57 turns off to deenergize the logic circuit block 11, the voltage at the connection point between the field effect transistor 61 (FIG. 2) and the resistor 62 becomes the grounding potential. The inverter 63 produces a high level detection signal at the wiring 64 which is supplied to the NOR gate 6 (FIG. 1) and the OR gate 7 through a non-inverting buffer 9. The output from the NOR gate 6 and the OR gate 7 is fixed at a low level and a high level, respectively, by the high level detection signal. The NAND gate 5 receives a low level detection signal through the inverter 10. The output from the NAND gate 5 is also fixed at a high level. The NAND gate 5, the NOR gate 6 and the OR gate 7 are inhibited from responding to the signals from the output stage in the logic circuit block 11.

In this manner, the RAM block 12 automatically changes so that it does not respond to the signal from the logic circuit block 11, if the power switch 57 turns off to deenergize the logic circuit block 11.

Therefore, the memorized contents in the RAM block 12 are not disturbed until the logic circuit block 11 is re-energized. Moreover, since the electrically operating conditions of the NAND gate 5, the NOR gate 6 and the OR gate 7 are fixed to produce logical high or low level signals. Those logic gates 5, 6 and 7 consume very little power when the logical high or low level is produced as an output signal, as compared to the power consumption during the transient period of the output signal from high to low level or from low to high level. Therefore, the operationally fixed RAM block 12 consumes very little power. Even if the power source 56 is a battery, the memorized contents in the RAM block 12 are maintained for a long period.

Figure 3:
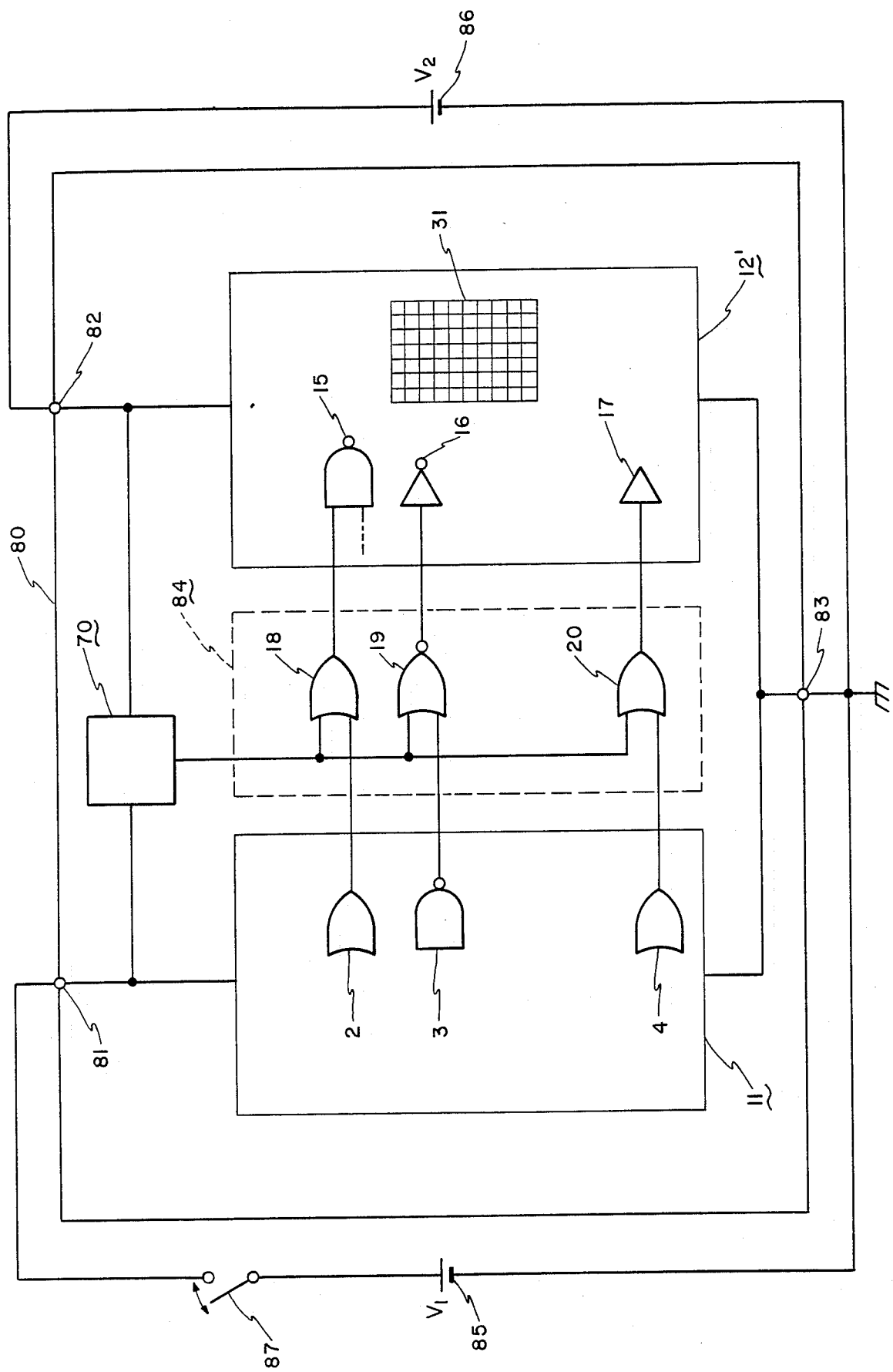
FIG. 3 is a brief circuit block diagram showing a second preferred embodiment of the present invention.

Next, a second preferred embodiment of the present invention will now be explained with reference to FIGS. 3 and 4. The semiconductor chip 80 (FIG. 3) has a logic circuit block 11, a RAM block 12', a power detector 70, and a signal controller 84 formed between the logic circuit block 11 and the RAM block 12' in order to control the signal supplied to the RAM block 12', in response to a detection signal from the power detector 70. The logic circuit 11 is energized by a power voltage of 5 volts, for example, supplied at a power terminal 81 from a power source 85 through a power switch 87. Similar, to the logic circuit block 11 shown in FIG. 1, block 11 has an output stage including an OR gate 2, a NAND gate 3 and another OR gate 4.

The RAM block 12' is energized by a power voltage of 5 volts, for example, supplied at a different power terminal 82 from a power source 86. The RAM block 12' has a RAM section 31 and an input stage including a NAND gate 15, an inverter 16 and a non-inverting buffer 17 to access the RAM section 31. The types of gates in the input stage are selected in accordance with the required signal process of signals applied from the logic circuit block 11 through the signal controller 84.

The signal controller 84 includes an OR gate 18 for receiving signals from the OR gate 2 and the power detector 70. A NOR gate 19 receives signals from the NAND gate 3 and the power detector 70 and an OR gate 20 receiving signals from the OR gate 4 and the power detector 70. The types of gates in the signal controller 84 are selected so as to pass the logic signal from the logic circuit block 11 in response to a low level detection signal from the power detector 70. These gates fix their output level at either a high or a low level in response to a high level detection signal. In a case of the second preferred embodiment (FIG. 2), the gates in the signal controller 84 are selected from OR and NOR gates. The logic circuit block 11 and the RAM block 12' are grounded through a grounding terminal 83.

Figure 4:
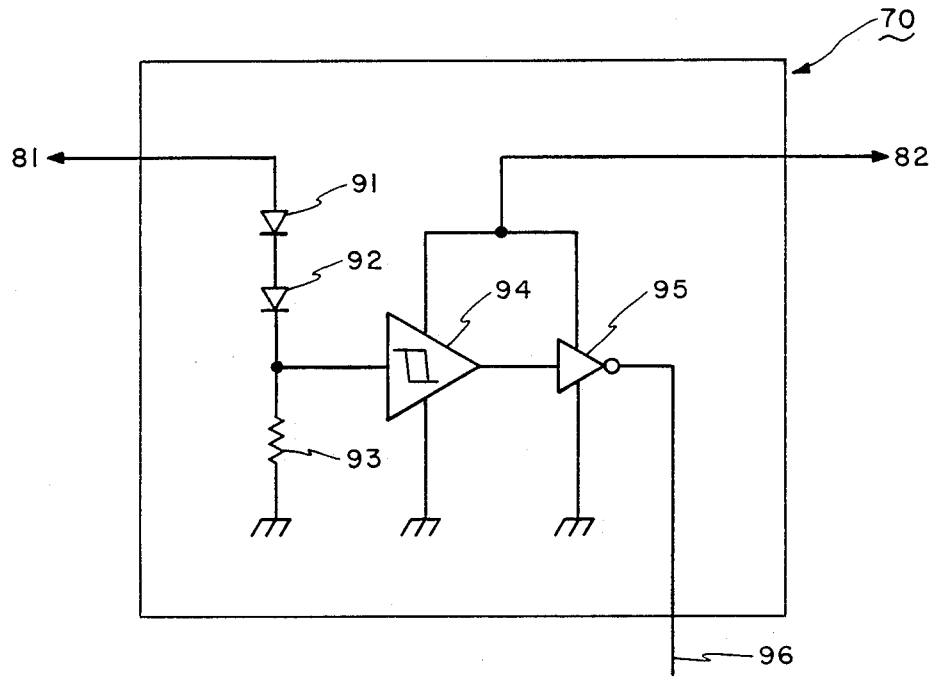
FIG. 4 is a circuit diagram showing a detection circuit used in the second preferred embodiment of FIG. 3.

The example of the power detector 70 is shown in FIG. 4. The voltage at the power terminal 81 is supplied to a series connection of diodes 91 and 92 and then to a resistor 93. The diodes 91 and 92 are connected so as to be forwardly biased. The resistance of the resistor 93 is about 100 kilo-ohms. A connection point between the diode 92 and the resistor 93 is connected to an input node of a Schmitt trigger circuit 94, the output node of which is connected to an input node of an inverter 95. An output node of the inverter 95 is connected to the signal controller 84 (FIG. 3) through a wiring 96. Both the Schmitt trigger circuit 94 and the inverter 95 is energized by the power voltage at the power terminal 82.

When the power switch 87 turns on to energize the logic circuit block 11, the voltage at the connection point between the diode 92 and the resistor 93 is about 3.8 volts. The Schmitt trigger circuit 94 generates an output of a high level. The inverter 95 produces a detection signal of a low level on the wiring 96. Therefore, the OR gates 18 and 20 in the signal controller 84 pass the signals from the OR gates 2 and 4 in the logic circuit block 11 to the NAND gate 15 and the non-inverting buffer 17 in the RAM block 12'. The NOR gate 19 in the signal controller 84 inverts the polarity of the signal from the AND gate 3 in the logic circuit block 11 to apply it to the inverter 16 in the RAM memory block 12′.

On the other hand, when the power switch 87 turns off to deenergize the logic circuit block 11, the voltage at the connection point between the diode 92 (FIG. 4) and the resistor 93 lowers to the grounding potential. The Schmitt trigger circuit 94 generates an output of a low level signal to produce a detection signal of a high level on the wiring 96 from the inverter 95. In response to the high level detection signal, the outputs of the OR gate 18 (FIG. 3) the NOR gate 19 and the OR gate 20 are fixed at a high level, a low level and a high level, respectively. Therefore, the gates 15, 16 and 17 of the input stage in the RAM block 12′ are locked in the respectively above-mentioned states. The memorized contents in the RAM memory block 12′ are not changed.

Similar to the first preferred embodiment shown in FIGS. 1 and 2, the second preferred embodiment (FIGS. 3, 4) automatically detect the deenergization of the logic circuit block 11 in order to fix the input signals which are applied to the input stage of the RAM block 12′ at either high or low logical levels. As a result, there is little excessive current which otherwise flows through gates in the input stage of the RAM block 12′ responsive to the floating electrical state of the input signals to the gates in the input stage. The power consumption during the deenergization of the logic circuit block 11 is saved. Furthermore, the memorized contents in the RAM block 12′ are protected when the logic circuit block 11 is deenergized.

Although some preferred embodiments were explained, the present invention is not limited to those embodiments. The invention is applicable to many semiconductor integrated circuits having a plurality of circuit blocks which are independently energized from different power sources. The RAM blocks 12 and 12′ may be replaced with a logic circuit block which are required to continue their operations when other circuit block is deenergized.

What is claimed is:

1. A semiconductor integrated circuit comprising:
   a first power terminal for receiving a first power having a first voltage;
   a second power terminal for receiving a second power having a second voltage;
   a first circuit block energized exclusively by said first power, said first circuit block having a plurality of input gates;
   a second circuit block energized exclusively by said second power, said second circuit block producing output signals which are supplied to said input gates of said first circuit block;
   detection circuit means for detecting a deenergization of said second circuit block in order to produce a detection signal; and
   means for controlling said input gates to produce predetermined output level signals in response to said detection signal, each of said input gates being logical gates for processing a binary logic signal, and each of said predetermined output level signals having one signal level of said binary logic signal, wherein said controlling means has a circuit for receiving said detection signal to produce first and second control signals, said first control signal having a non-inverted relationship with respect to said detection signal and said second control signal having an inverted relationship with respect to said detection signal, wherein each of said input gates receives a selected one of said first and second control signals together with one of said output signals from said second circuit block, said selected one of said first and second control signals causing a predetermined output level signal from said input gates.

2. A semiconductor integrated circuit as claimed in claim 1, wherein said first circuit block includes a RAM memory.

3. A semiconductor integrated circuit as claimed in claim 2, wherein said controlling means includes logical gates, each of said gates receiving said detection signal from said detection circuit means and one of said output signals from said second circuit block, said controlling means applying an output signal to one of said input gates, each of said logical gates of said controlling means responding to said detection signal by switching each output signal level of said input gates to a predetermined output level signal.

4. A semiconductor integrated circuit as claimed in claim 3, wherein said logical gates of said controlling means are selected from OR and NOR gates.

5. A semiconductor integrated circuit including a logic circuit block and a RAM block which are formed on a single semiconductor chip and which are independently energized, said RAM block having a RAM memory section and an input stage for receiving output signals from said logic circuit block to access said RAM memory section, said semiconductor integrated circuit further comprising a detection circuit for detecting a deenergization of said logic circuit block in order to produce a detection signal, and means for controlling said input stage to fix output levels of said input stage in response to said detection signal, wherein said controlling means includes logical gates selected from OR and NOR gates, each of said selected logical gates receiving said detection signal and one of said output signals from said logic circuit block and applying an output to said input stage.

6. A semiconductor integrated circuit as claimed in claim 5, wherein said controlling means includes an inverter for receiving said detection signal to produce an inverted detection signal and a non-inverting buffer for receiving said detection signal, a selected one of said inverted and non-inverted detection signals being applied to logical gates in said input stage together with output signals from said logic circuit block.

* * * * *